(12) United States Patent
Fujioka et al.

(10) Patent No.: US 6,535,069 B2
(45) Date of Patent: *Mar. 18, 2003

(54) HIGH-FREQUENCY POWER AMPLIFIER MODULE

(75) Inventors: Toru Fujioka, Kokubunji (JP); Isao Yoshida, Nishitama (JP); Mineo Katsueda, Hachioji (JP); Masatoshi Morikawa, Saitama (JP); Yoshikuni Matsunaga, Hachioji (JP); Kenji Sekine, Nishitama (JP); Osamu Kagaya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/084,364

(22) Filed: Feb. 28, 2002

(65) Prior Publication Data

US 2002/0089380 A1 Jul. 11, 2002

Related U.S. Application Data

(63) Continuation of application No. 09/673,977, filed on Oct. 25, 2000.
(60) Provisional application No. PCT/JP98/03069, filed on Jul. 8, 1998.

(51) Int. Cl.[7] .............................. H03F 3/04; H03F 3/68
(52) U.S. Cl. ...................... 330/302; 330/306; 330/310
(58) Field of Search ................................. 330/302, 306, 330/310

(56) References Cited

U.S. PATENT DOCUMENTS

| 5,969,582 | A | 10/1999 | Boesch et al. ............... 333/129 |
| 6,043,721 | A | 3/2000 | Nagode et al. .............. 330/150 |
| 6,134,427 | A | 10/2000 | Hughes ....................... 330/126 |
| 6,236,274 | B1 | 5/2001 | Liu .............................. 330/302 |
| 6,400,963 | B1 * | 6/2002 | Glockler et al. ............ 333/104 |

FOREIGN PATENT DOCUMENTS

| JP | 60-109310 | 6/1985 |
| JP | 10-56339 | 2/1998 |

* cited by examiner

*Primary Examiner*—Patricia Nguyen
(74) *Attorney, Agent, or Firm*—Mattingly, Stanger & Malur, P.C.

(57) ABSTRACT

A radio frequency power amplifier module for a dual-band type mobile communication apparatus that can transmit and receive a first frequency $f1$ and second frequency $f2$ ($f2=2\times f1$). It includes a drive stage amplifier having the gain peaks at $f1$ and $f2$ with a matching circuit and a radio frequency power output circuit including a radio frequency power output transistor. The output circuit has a transmission line connected to the drain end of the output transistor, a parallel resonance circuit connected in series to the transmission line to resonate at harmonics of a frequency twice the frequency $f2$, a series resonance circuit provided between one end of the resonance circuit and the ground to resonate at harmonics of a frequency twice the frequency $f2$ and an output matching circuit provided in series to the other end of the parallel resonance circuit for matching with $f1$ and $f2$.

5 Claims, 7 Drawing Sheets

(a)

(b)

*ZL : R=50ohm, X=0ohm

PRIOR ART

PRIOR ART

HIGH-FREQUENCY POWER AMPLIFIER MODULE

This is a continuation application of U.S. Ser. No. 09/673,977, filed Oct. 25, 2000; which is a 371 of PCT/JP98/03069, filed Jul. 8, 1998.

TECHNICAL FIELD

The present invention relates to a high-frequency power amplifier module for amplifying high-frequency signal and particularly to a high-frequency power amplifier module that may be used suitably to a dual-band system radio equipment that can transmit and receive a couple of band frequencies.

BACKGROUND ART

In the European digital cellular system that is now put into the service as the mobile communication system, it is assumed in the GSM (Global System for Mobile Communication) using the frequency of 0.9 GHz band that subscribers will exceed the system capacity in near future. Therefore, the mobile telephone apparatus (hand-held telephone) corresponding to the dual-band system using, in combination with the GSM system, the DCS (Digital Cellular System) 1800 system using the frequency band near 1.8 GHz is requested because this system is similar to the GSM communication system in such a point that the same modulation system GMSK (Gaussian-filtered Minimum Shift Keying) is introduced.

Here, since above two systems (GSM system and DCS1800 system) are almost used in common except for the frequency, it is possible go structure the hand-held telephone set that is used in common in the GSM/DCS1800 systems by providing only the high frequency unit such as the power amplifier module that can be used for dual band system.

Therefore, in order to achieve the power amplifier module corresponding to the dual-band system, two power amplifier module systems corresponding to each communication system are integrated within the module and are structured to selectively switch each system as required.

FIG. 7 illustrates a schematic structure of the mobile telephone apparatus discussed prior to the present invention. In the same figure, a reference numeral 13 designates a blanching filter; 14, a dual-band transmitting/receiving antenna; 15, a first radio frequency power amplifier module (RF power module); 16, a second RF power module; 17, a wide-band amplifier (WAMP); 18, a radio frequency signal processing unit (RFSPU); 19, a system control unit (CNTU) consisting of the central processing unit (CPU); 20, an operation panel (OP); 21, a transceiver consisting of a speaker (SP) and a microphone (MIC) or the like. Vcc designates the power supply voltage. Moreover, the communication systems that can be used through the switching operation include the GSM system and DCS1800 system.

A radio signal processing circuit 18 is comprised of a modem processing unit, transmitting/receiving IF (intermediate frequency) unit and frequency converting unit (up-/down-converter) or the like and a radio signal (f1 or f2) of any one of the GSM system of 0.9 GHz band or the DCS1800 system of 1.8 GHz band selected is generated and output at the transmitting time. These two kinds of radio transmitting signals f1, f2 are input respectively to the first RF power module 15 and the second RF power module 16.

The RF power module 15 is a power amplifier module corresponding to the GSM communication system and is comprised of an RF power MOS field effect transistor T1 for final stage amplifier, matching circuits MC1 and MC2 consisting of passive elements, and an inductance element Lc1 for DC choke of drain bias. In this case, the transistor T1 is formed to provide an output, through the switching of a gate voltage to cutoff bias level and predetermined bias level, with the first bias control signal 22 output from the CPU of system control unit 19 interlocked with the GSM/DCS1800 selection switch of the mobile communication apparatus body.

In the same manner, the RF power module 16 is the power amplifier module corresponding to the DCS1800 communication system and is comprised of the RF power MOS field effect transistor T2 for final stage amplifier, matching circuits MC3 and MC4 consisting of passive elements, and inductance element Lc2 for DC choke of drain bias. In this case, the transistor T2 is formed to provide an output, through the switching of gate voltage impressed to the transistor T2 to the cutoff bias level and the predetermined bias level with the second bias control signal 23 output from the CPU of system control unit 19 interlocked with the GSM/DCS1800 selection switch of the mobile communication apparatus body.

The RF power modules 15 and 16 are respectively designed in optimum to set the matching with the matching circuits MC1 to MC4 so that the radio signals of the respective communication systems can be amplified effectively.

Thereby, the apparatus is operated as a hand-held telephone set of the GSM system, the bias control signal 22 of the RF power module 15 is set to the predetermined bias level and meanwhile the bias control signal 23 of the RF power module 16 is set to the cutoff bias level. Thereby, it is possible to selectively operate only the RF power module 15 to amplify the GSM radio signal f1 (0.9 GHz band).

When the apparatus is operated as a hand-held telephone set of the DCS1800 system, the bias control signal 23 of the RF power module 16 is set to the predetermined bias level and meanwhile the bias control signal 22 of the RF power module 15 is set to the cutoff bias level, thereby only the RF power module 16 is selectively operated to amplify the DCS1800 radio signal f2 (1.8 GHz band).

The structure explained above is selectively used depending on the setting of communication system by respectively providing the exclusive RF power modules within the apparatus for two communication systems. The RF power modules provided within the apparatus are designed in the optimum manner for respective communication system, assuring economical and effective operation.

Moreover, the radio frequency power amplifier module used in the hand-held telephone set is required to satisfy the specifications of the high frequency characteristic determined by each system such as the output power and is also required to satisfy further high efficiency and reduction in size.

Here, the technique to control the harmonics is well known as the technique to realize further high efficiency operation of the power amplifier for transmitter. For example, the Japanese Published Unexamined Patent Application No. SHO 60(1985)-109310 discloses the structure that one end part of the ¼ wavelength transmission line is terminated at a higher frequency, while the other end thereof is connected to an amplifier element and a series resonant circuit to obtain the desired basic waveform signal output from the serial resonant circuit. With this structure, the connecting point of the output side of the amplifying element and ¼ wavelength transmission line is terminated for the basic waveform and odd number order harmonics and thereby the ideal class F operation mode in which a current and a voltage at the output terminal of the amplifying element become zero can be obtained, and high efficiency can also be attained.

The high frequency power amplifier circuit of the related art forms a power amplifier circuit, as illustrated in FIG. 8(a), by connecting the other end of the ¼ wavelength transmission line 24 with one end thereof is terminated for high frequency signal to the output side of an amplifying element 25 and one end of a series resonance circuit 26 and the other end of the series resonance circuit 26 to an output terminal 27. Here, when the amplifying element 25 operates upon input of a basic signal, the voltages are distributed on the ¼ wavelength transmission line 23. FIG. 8(b) illustrates the condition of voltage distribution on the ¼ wavelength transmission line 24. This voltage distribution can be obtained for signal inputs of basic frequency signal and double-frequency signal. Sine one end II of the ¼ wavelength transmission line 24 is perfectly terminated for high frequency signal, the voltages are applied to the connection part I to open for the basic frequency signal and to terminate for the double-frequency signal. Moreover, above voltage distribution is similar to the third harmonics or higher and the connection part I is opened for all odd number order harmonics as in the case of the basic frequency signal and is terminated as in the case of the double-frequency signal for all even number order harmonics.

However, when the high efficiency technique is applied to the circuit structure of FIG. 7 explained above, a couple of power amplifier modules adding the circuit for harmonics control as explained above are required, resulting in the disadvantage that the circuit configuration becomes large in size.

Accordingly, it has been expected that the structure of the radio frequency power amplifier module is designed to realize the radio frequency power amplifier module corresponding to high efficiency dual-band system to be used in a couple of frequency bands for one system using in common the one-input and one-output driving stage amplifier and radio frequency output transistor for two communication systems.

Moreover, a method for controlling the harmonics using the ¼ wavelength transmission line of the related art has a problem when the power amplifier module is adopted to the hand-held telephone system for two different frequencies as in the case of the structure illustrated in FIG. 7. For example, when the related art is applied to the hand-held terminals that is used in common to the GSM system using the frequency around 0.9 GHz band and the DCS1800 system using the frequency around 1.8 GHz band, the transmission lines are respectively required for the GSM and DCS1800 systems and therefore it is difficult to reduce the size of the apparatus. Moreover, since requirement for reduction in size of package is quite intensive in recent years, it is very difficult to comprise the (¼)-wavelength transmission lines for 0.9 GHz and 1.8 GHz within the same package.

In addition, in the case of the method wherein the circuit configuration is comprised of the power amplifier only for GSM system and the power amplifier only for DCS1800 system and both circuits are selectively used, reduction in size is quite difficult because a couple of power amplifiers are provided.

For reduction in size, it is effective that the drive stage amplifier used in the radio frequency power amplifier modules for GSM system and DCS1800 system, and the radio frequency power output transistor are used in common for both systems. However, here rises a problem that efficiency is lowered because output power is different to a large extent in both systems.

The present invention has been proposed to solve such problem and it is therefore an object of the present invention to provide a small size and high efficiency power amplifier module corresponding to the dual-band communication system using in common two kinds of frequencies.

DISCLOSURE OF THE INVENTION

The radio frequency power amplifier module of the present invention can be suitably used for the dual-band type radio apparatus that can transmit or receive two kinds of band frequencies f1, f2 (f1<f2), the drive stage amplifier and radio frequency power transistor forming this radio frequency power amplifier module can be used in common for the radio signal of both systems, and an output stage circuit including the radio frequency power output transistor is formed of a radio frequency power output transistor, a transmission line connected to the drain end of the radio frequency power output transistor to control the radio frequency power, a parallel resonance circuit connected in series with this transmission line, a series resonance circuit connected in series and an output matching circuit matched with the band frequencies of both systems to extract the basic frequency element.

Here, the parallel resonator is set to resonate at the frequency corresponding to the predetermined even number order harmonics of the band frequency f2, while the transmission line is set to terminate for the even number order harmonics in the impedance of the drain end using a parasitic reactance existing at the drain of the radio frequency power output transistor. Moreover, the constants of the circuit elements forming the parallel resonator are set so that the impedance of drain end is opened for the predetermined odd number order harmonics of the frequency f1 through combination of the series resonator that is set to resonate at the frequency corresponding to the predetermined odd number order harmonics of the band frequency f1, transmission line and parasitic reactance of the radio frequency power output transistor.

With such structure, when the power amplifier module is operated, the harmonics signal is controlled for the radio signal of the system. Therefore, generation of heat that is generated when a product of the current and voltage at the output terminal of the radio frequency power output transistor of the power amplifier module does not become zero can be controlled and thereby efficiency can be improved. Namely, it is now possible to form the high efficiency and small size radio frequency power amplifier module corresponding to the dual-band system.

BRIEF DESCRIPTION OF THE DRAWINGS

FIG. 5(a) is a circuit configuration diagram, while FIG. 5(b) is a Smith chart diagram.

BEST MODE FOR CARRYING OUT THE INVENTION

Next, the preferred embodiments of the radio frequency power amplifier module of the present invention will be explained in detail below with reference to the accompanying drawings.

[Embodiment 1]

Figure 1:
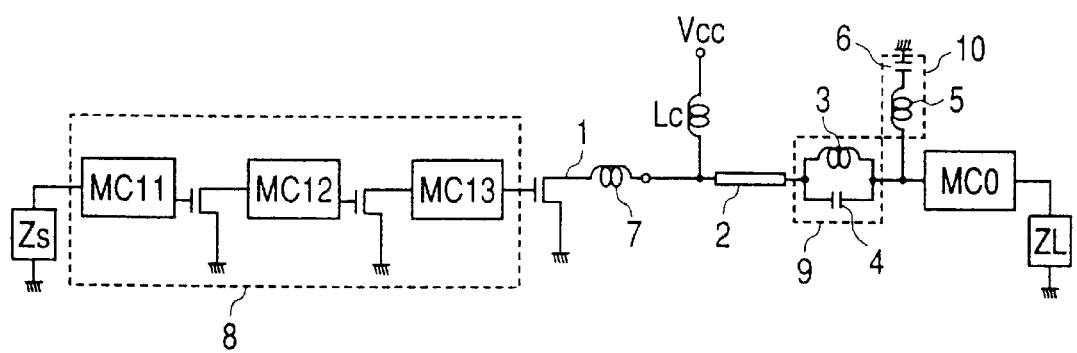
FIG. 1 is a circuit diagram illustrating an embodiment of the radio frequency power amplifier module of the present invention.

FIG. 1 is a circuit diagram of the high frequency power amplifier module for the GSM/DCS1800 dual-band as an embodiment of the radio frequency power amplifier module of the present invention. As illustrated in FIG. 1, the reference numeral 1 designates a radio frequency power output transistor (Si-MOSFET chip) for radio signal power amplification; 2, a transmission line; 3, an inductor for parallel resonance circuit; 4, a capacitor for parallel resonance circuit; 5, an inductor for series resonance circuit; 6, a capacitor for series resonance circuit; 7, a parasitic reactance of the radio frequency power output transistor 1; 8, a drive stage amplifier; 9, a parallel resonance circuit; 10, a series resonance circuit; Zs, a source impedance; ZL, a load impedance; Lc, a DC bias power feeding choke coil; MC11 to MC13, matching circuits of drive stage amplifier; MCO is an output matching circuit for matching with the load impedance ZL for each amplified frequency of the GSM/DCS1800 system.

Figure 2:
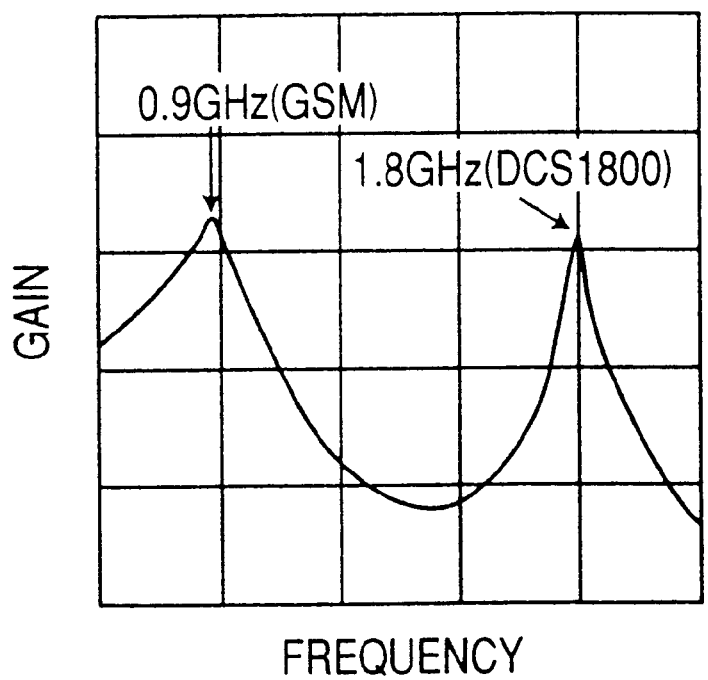
FIG. 2 is a characteristic diagram illustrating the gain characteristic of the drive stage amplifier used in the circuit of FIG. 1.
Figure 7:
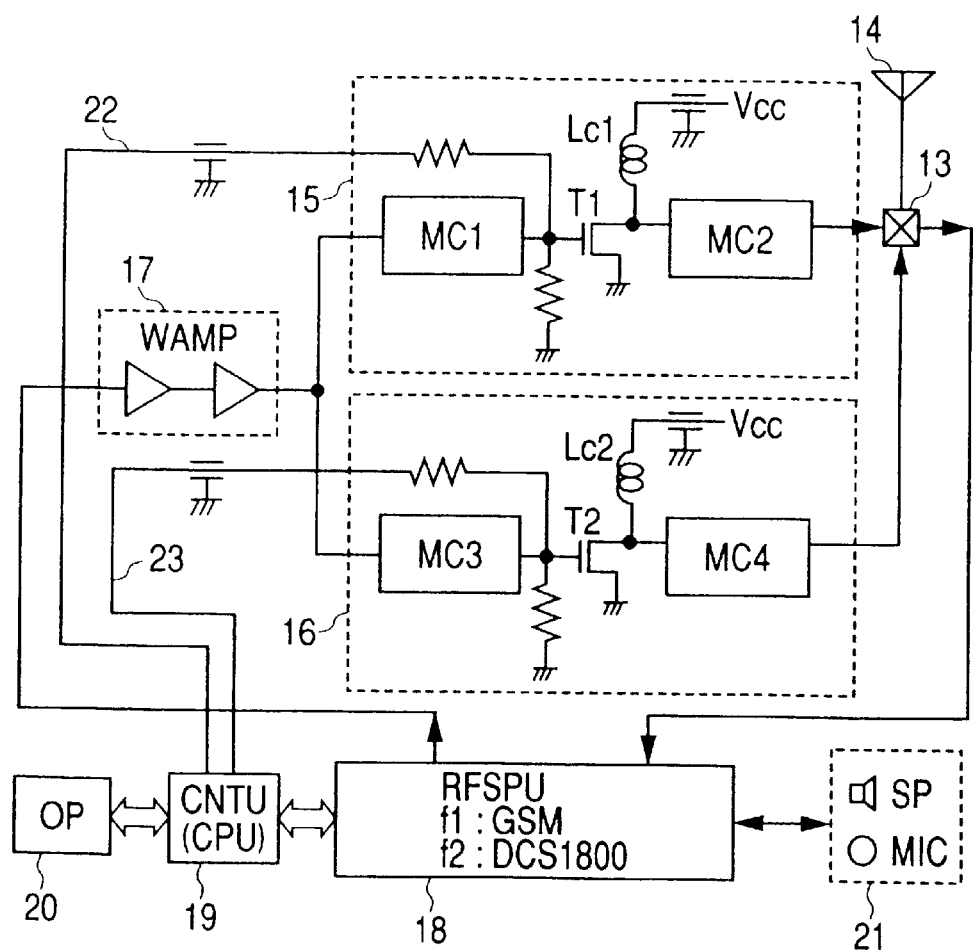
FIG. 7 is a circuit diagram illustrating an example of the structure of mobile communication apparatus discussed prior to the present invention.
Figure 8:
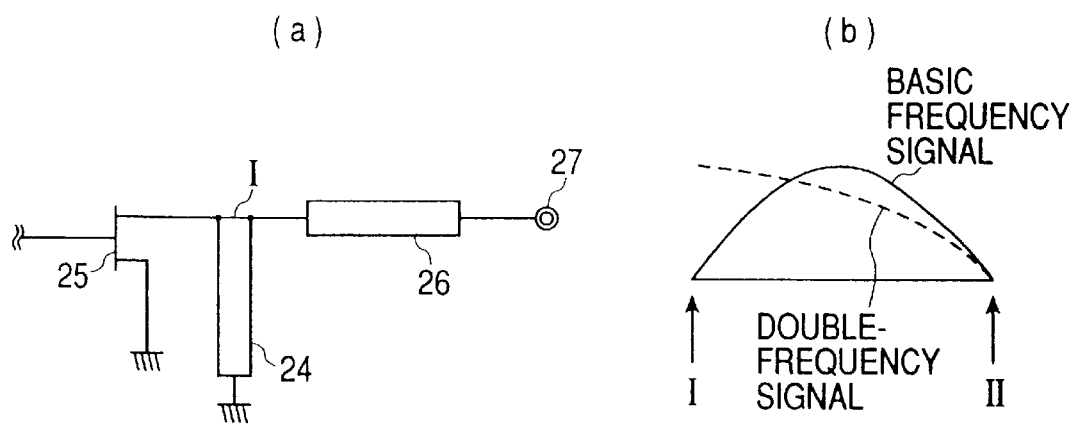
FIG. 8 is a circuit diagram for explaining an example of the power amplifier module of the related art.

The drive stage amplifier 8 is formed of two-stage Si-MOSFET and has the structure almost similar to that of the power amplifier 17 of the related art of FIG. 7. This amplifier 8 is matched with the two frequencies of the GSM communication system and DCS1800 communication system with the matching circuits MC11 to MC13. In this case, the peak of gain exists at such frequency. FIG. 2 illustrates the frequency characteristic of the gain when the drain bias Vcc of the drive stage amplifier 8 is set to 3.6V and the matching is set so that the peak of gain exists in the 0.9 GHz band of the GSM system and the 1.8 GHz band of the DCS1800 system. This matching can be realized, for example, by combining inductance element and capacitance element and also setting the values of these elements to the adequate values to obtain the high gain. With this drive stage amplifier 8, the radio signals of two kinds of frequencies are amplified up to a high gain and thereafter input to radio frequency power output transistor 1.

Owing to this characteristic, since the drive stage amplifier 8 has the band-pass filter characteristic, in comparison with the apparatus illustrated in FIG. 7 using an amplifier having the wide band frequency characteristic in order to cover both frequency bands (f1 to f2) of the GSM system and DCS1800 systems within the amplifier band, the radio frequency signal input to the radio frequency power output transistor can be amplified under the condition that leak of harmonics resulting in the deterioration of communication quality is prevented.

Moreover, an output circuit of the radio frequency power output transistor 1 in the final stage is comprised, in order to amplify the radio signal output from the drive amplifier 8 with higher efficiency, of the transmission line 2 for harmonics control, a parallel resonance circuit 9, a series resonance circuit 10 and an output matching circuit MCO consisting of an inductance element and a capacitance element or the like to attain the matching with the load impedance ZL for each amplified signal frequency (2.7 GHz and 3.6 GHz) of the GSM/DCS1800 communication systems.

In the output circuit of the radio frequency power output transistor structured as explained above in the final stage, the parallel resonance circuit 9 is set to resonate at 3.6 GHz so that the impedance becomes large at 3.6 GHz. Moreover, values of inductance 3 for parallel resonance circuit and capacitor 4 for parallel resonance circuit are set to open the drain end of the radio frequency power output transistor 1 at 2.7 GHz as well as the parasitic reactance 7 existing at the drain of the radio frequency power output transistor 1 and the transmission line 2. Moreover, the series resonance circuit 10 is set to resonate at 2.7 GHz so that the impedance at 2.7 GHz becomes small.

In this case, when the radio frequency power output transistor 1 receives the basic frequency signal of GSM(0.9 GHz)/DCS1800(1.8 GHz) to operate, the equivalent circuit is different for the frequency of 3.6 GHz which is the double-frequency signal of 1.8 GHz and for the frequency of 2.7 GHz which is the triple-frequency signal of 0.9 GHz, and therefore the voltages at the drain end is also different.

Figure 3:
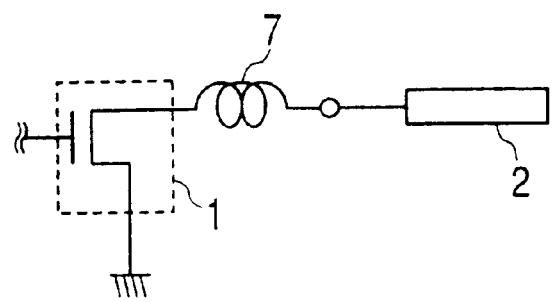
FIG. 3 is an equivalent circuit diagram during operation at 3.6 GHz of the circuit of FIG. 1.

Since the parallel resonance circuit 9 resonates at 3.6 GHz resulting in enlargement of the impedance of such parallel resonance circuit 9, the circuit of FIG. 1 may be illustrated as the equivalent circuit of FIG. 3.

Here, the transmission line 2 has parasitic reactance 7 existing at the drain of the radio frequency power output transistor 1 and is set to the length to terminate the drain end of the radio frequency power output transistor 1 for 3.6 GHz. When the radio frequency power output transistor 1 receives the signal input of the frequency of 3.6 GHz which is twice the frequency used in the DCS1800 system to operate, the impedance is converted while the signal enters the drain end of the radio frequency power output transistor 1 through the transmission line 2 and parasitic reactance 7 from the open end of the transmission line 2 and thereby the potential of each point changes. Here, the drain end of the radio frequency power output transistor 1 is terminated.

Figure 4:
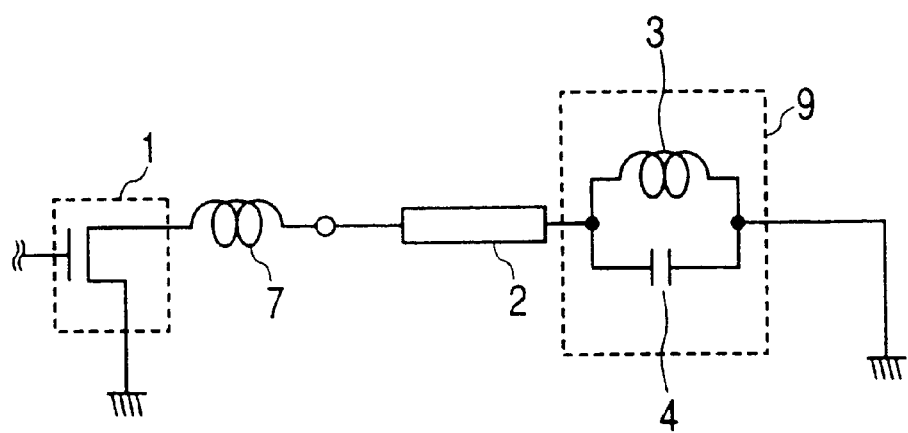
FIG. 4 is an equivalent circuit diagram during operation at 2.7 GHz of the circuit of FIG. 1.

Moreover, since the series resonance circuit 10 is structured to resonate at 2.7 GHz to make small the impedance of the series resonance circuit 10 at 2.7 GHz, the circuit of FIG. 1 becomes identical to the equivalent circuit of FIG. 4 at the frequency of 2.7 GHz which is three times the frequency used in the GSM system.

Here, the values of the inductor 3 and capacitor 4 forming the parallel resonance circuit 9 are set to open the drain end of the radio frequency power output transistor 1 at 2.7 GHz, together with the transmission line 2 and parasitic reactance 7. When the radio frequency power output transistor 1 receives the signal input of 2.7 GHz to operate, impedance is converted and potential of each point changes while the signal reaches the drain end of radio frequency power output transistor 1 via the parallel resonance circuit 9, transmission line 2 and parasitic reactance 7 from the open end of the parallel resonance circuit 9, and the drain end of the radio frequency power output transistor 1 opens.

For instance, in the case where the parasitic reactance 7 of the radio frequency power output a transistor 1 is 0.04 nH and a chip element is used in the resonance circuits 9, 10 at the time of design when the inductance value of chip inductor 3 is set to 0.4 nH and the capacitance value of chip capacitor 4 is set to 4.9 pF, the resonance frequency of the parallel resonance circuit 9 becomes equal to $f_r$=3.6 GHz= $1/(2\pi\sqrt{(0.4\times10^{-9}\times4.9\times10^{-12})})$.

In this case, the equivalent circuit for 3.6 GHz that is the double frequency signal of the DCS1800 system is illustrated in FIG. 3. In this equivalent circuit, the impedance of drain end is terminated. Therefore the equivalent circuit depends on the specific dielectric coefficient and thickness of the substrate. However, when the ceramic substrate having specific dielectric coefficient of 8.452 and thickness of 0.15 mm is used, the length of transmission line is set to 8.55 mm. This length is shorter than the ¼ wavelength because the parasitic reactance element is used.

Moreover, when the capacitance value of chip capacitor 6 is set to 0.64 pF and the inductance value of chip inductor 5 is set to 5.4nH, the resonance frequency of the series resonance circuit 10 is expressed as $f_r$=2.7 GHz=$1/(2\pi\sqrt{(0.64\times10^{-12}\times5.4\times10^{-9})})$.

Therefore, the equivalent circuit for 2.7 GHz that is three times the frequency of GSM system is illustrated in FIG. 4 and the values of the chip inductor 3 and chip capacitor 4 are not only set to resonate at 3.6 GHz but also set to make open the impedance of the drain end of the Si-MOSFET together with the preset size of the transmission line 2 and parasitic reactance 7.

As explained above, impedance at the drain end of radio frequency power output transistor 1 is opened at 2.7 GHz that is three times the frequency of the GSM system and is terminated at 3.6 GHz that is twice the frequency of the DCS1800 system.

Figure 5:
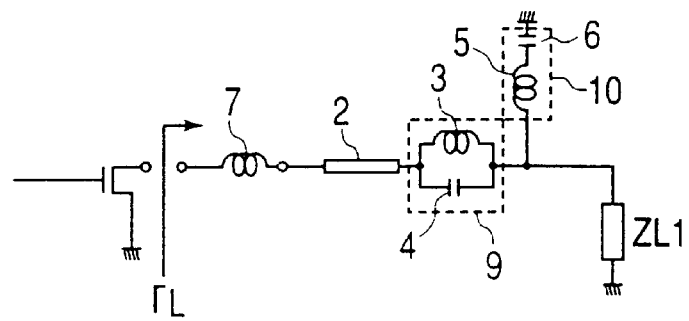
FIGS. 5(a) and 5(b) are diagrams for explaining the impedance at the drain end of the output stage transistor in the circuit of FIG. 1
Figure 5:
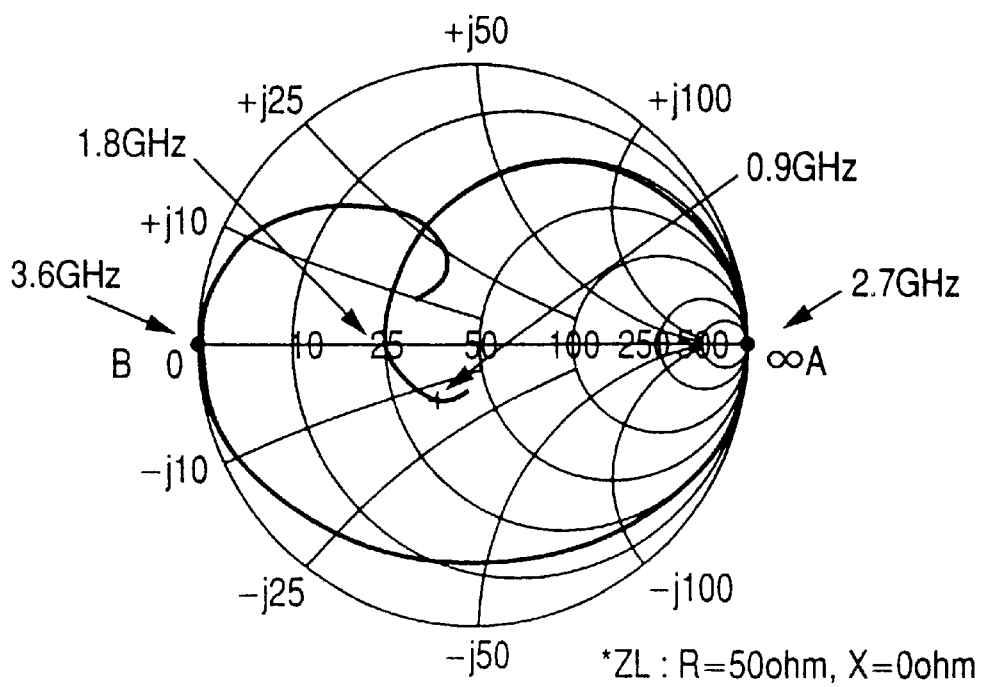

FIG. 5(a) is a circuit configuration diagram of the radio frequency control circuit designed as explained above in order to obtain the impedance assumed from the drain end of the radio frequency power output transistor 1 assuming the termination load (load impedance) ZL1 as 50Ω.

In this figure, ΓL is a reflection coefficient in the output side viewed from the drain end of the radio frequency power output transistor 1 and the standard value of this coefficient 50Ω. FIG. 5(b) illustrates the locus of reflection coefficient ΓL on the Smith chart for the frequency. From this figure, it can be understood that the reflection coefficient exists at the center area of the Smith chart for the signal frequency of 0.9 GHz of the GSM system and the signal frequency of 1.8 GHz of the DCS1800 system, while it exists at the position of the point A indicating the open end at 2.7 GHz that is three times the frequency of 0.9 GHz and at the position of the point B indicating the termination end at 3.6 GHz that is twice the frequency of 1.8 GHz. Above result is obtained when the termination load is set to 50Ω, but above harmonics control is satisfied even at the desired termination load impedance.

Each radio signal output having completed the harmonics control explained above is then output through the output matching circuit MCO for the basic frequency signal of the radio signal.

As explained above, since the radio frequency power amplifier module of this embodiment controls the triple frequency signal for the GSM system and the double frequency signal for the DCS1800 system and thereby controls the harmonics cower and realizes high efficiency amplification.

[Embodiment 2]

Figure 6:
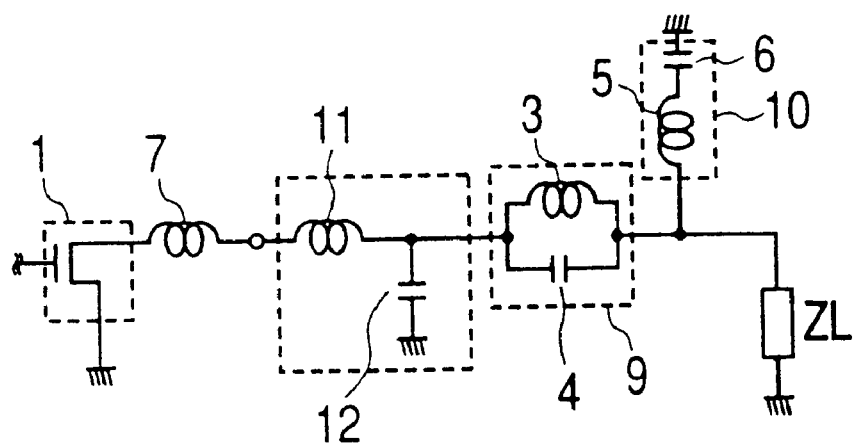
FIG. 6 is a circuit diagram illustrating another embodiment of the radio frequency power amplifier module of the present invention.

FIG. 6 is a circuit diagram of the radio frequency power amplifier module corresponding to the GSM/DCS1800 dual-band illustrating another embodiment of the radio frequency power amplifier module of the present invention. In FIG. 6, the structure of drive stage amplifier for driving the radio frequency power output transistor 1 is identical to that of FIG. 1 and it is not illustrated in FIG. 6. Moreover, the structural elements identical to that illustrated in FIG. 1 are designated with the like reference numerals and detail explanation of such elements is omitted here. Namely, this embodiment is different from the embodiment explained previously in such a point that the radio frequency power amplifier module is formed using the centralized constant inductor 11 and centralized constant capacitor 12 in place of the transmission line 2 illustrated in FIG. 1.

Operations of this radio frequency power amplifier module are identical to that of the embodiment explained above, but in the structure of FIG. 6, the circuit can be reduced in size in comparison with the circuit of the first embodiment of FIG. 1 by utilizing the chip inductor and chip capacitor in place of the transmission line that requires large circuit area.

Even in this embodiment, like the power amplifier module of FIG. 1, high load efficiency and reduction in size can be realized simultaneously even in both DSM/DCS1800 transmission systems.

In addition, in above two embodiments, the Si-MOFET has been used for the drive stage amplifier and radio frequency power output transistor, but it is naturally possible to use, in place of the SI-MOSFET, the active elements such as GaAs-MESFET and bipolar transistor that can process the RF signal.

The preferred embodiments of the present invention have been explained but the present invention is not limited to such embodiments and the present invention naturally allows various changes and modifications within the scope of the spirit of the present invention. For instance, the GMSK modulation systems are used in both embodiments but various digital modulation systems such as π/4 shift QPSK (Quadrature Phase Shift Keying) modulation system QPSK modulation system, offset QPSK modulation system or the like and various analog modulation systems such as FM modulation system, AM modulation system or the like can also be applied and there is no limitation on the frequency.

INDUSTRICAL APPLICABILITY

According to the present invention, the radio frequency power amplifier module to be used for the dual-band system radio apparatus that can transmit and receive two kinds of band frequencies having two kinds of communication systems as the radio communication system can save consumption of unwanted harmonics power by controlling respective harmonics of two different band frequencies.

Moreover, since the drive stage amplifier forming the radio frequency power amplifier module of the present invention realizes high gain and controls harmonics leak power through the matching conforming to two kinds of frequency, high efficiency can be achieved and operation life of the battery can be extended.

In addition, since the drive stage amplifier and radio frequency power output transistor forming the radio frequency power amplifier module of the present invention are used in common for both band frequencies, one system structure can be used in common for both band frequencies and thereby it can be used in size.

What is claimed is:

1. A radio frequency power amplifier module used in a dual-band type mobile communication apparatus that can transmit and receive first and second band frequencies, comprising a radio frequency power output circuit including a radio frequency power output transistor used in common for both band frequencies where the second band frequency is higher than the first band frequency, where said radio frequency power output circuit comprises:

an impedance connected in series to the output end of said radio frequency power output transistor;

a parallel resonance circuit that is connected in series to said impedance to resonate at the predetermined even number order harmonics of the second band frequency;

a series resonance circuit that is connected to said parallel resonance circuit and grounded in the other end thereof to resonate at the predetermined odd number order harmonics of the first band frequency; and an output matching circuit that is connected to said parallel resonance circuit for matching with both first and second frequency bands, wherein said impedance is set to terminate for the even number order harmonics of said second band frequency at the output end of said radio frequency power output transistor with parasitic reactance existing at the output end of said radio frequency power output transistor, and wherein said parallel resonance circuit is set to open for the odd number order harmonics of said first band frequency at the output end of said radio frequency power output transistor with said series resonance circuit, said impedance and the parasitic reactance existing at the output end of said radio frequency power output transistor.

2. A radio frequency power amplifier module according to claim 1, wherein said second band frequency is twice the frequency of said first band.

3. A radio frequency power amplifier module according to claim 2, wherein said impedance is formed of a transmission line.

4. A radio frequency power amplifier module according to claim 3, wherein said impedance is comprised of a combination of centralized constant inductor and a centralized constant capacitor.

5. A radio frequency power amplifier module according to claim 4, wherein said radio frequency power amplifying output transistor is a Si-MOSFET.

* * * * *